United States Patent [19]
Hoenigschmid et al.

[11] Patent Number: 5,821,592
[45] Date of Patent: Oct. 13, 1998

[54] DYNAMIC RANDOM ACCESS MEMORY ARRAYS AND METHODS THEREFOR

[75] Inventors: Heinz Hoenigschmid, Wappingers Falls, N.Y.; John DeBrosse, Burlington, Vt.

[73] Assignees: Siemens Aktiengesellschaft, Munich, Germany; International Business Machines Corporation, Armonk, N.Y.

[21] Appl. No.: 884,853

[22] Filed: Jun. 30, 1997

[51] Int. Cl.$^6$ ............................ H01L 29/68; H01L 27/108
[52] U.S. Cl. ............................ 257/390; 257/71; 257/206; 257/296; 257/905; 257/907
[58] Field of Search ................................ 257/68, 71, 206, 257/296, 390, 905, 907, 908

[56] References Cited

U.S. PATENT DOCUMENTS

| | | | |
|---|---|---|---|
| 5,378,906 | 1/1995 | Lee | 257/296 |
| 5,600,162 | 2/1997 | Rosner | 257/311 |
| 5,747,844 | 5/1998 | Aoki et al. | 257/296 |

*Primary Examiner*—Valencia Wallace
*Attorney, Agent, or Firm*—Stanton C. Braden

[57] ABSTRACT

A dynamic random access memory array having an array of memory cells. Individual cells of the array are addressable by a plurality of word lines and a plurality of bit lines. The memory cells are disposed in active areas of the array. The array of memory cells includes a first strip of memory cells. The dynamic random access memory array includes a lower metal layer and an upper metal layer disposed above the lower metal layer. The dynamic random access memory array further includes a dielectric layer disposed between the lower metal layer and the upper metal layer. There is further included a first bit line of the plurality of bit lines which includes a lower metal first bit line portion implemented in the lower metal layer. The lower metal first bit line portion is coupled to a first plurality of memory cells of the first strip of memory cells. The first bit line also includes an upper metal first bit line portion implemented in the upper metal layer. The upper metal first bit line portion is coupled to the lower first metal bit line portion by a first contact through the dielectric layer. The first contact is disposed above one of the active areas.

20 Claims, 7 Drawing Sheets

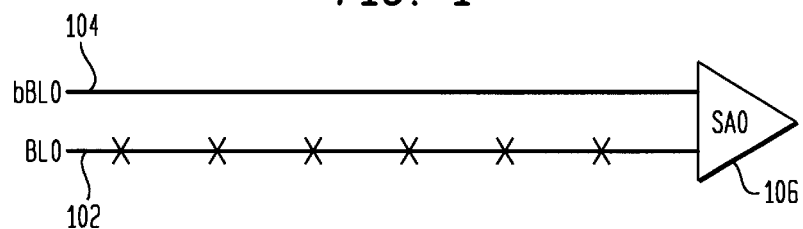
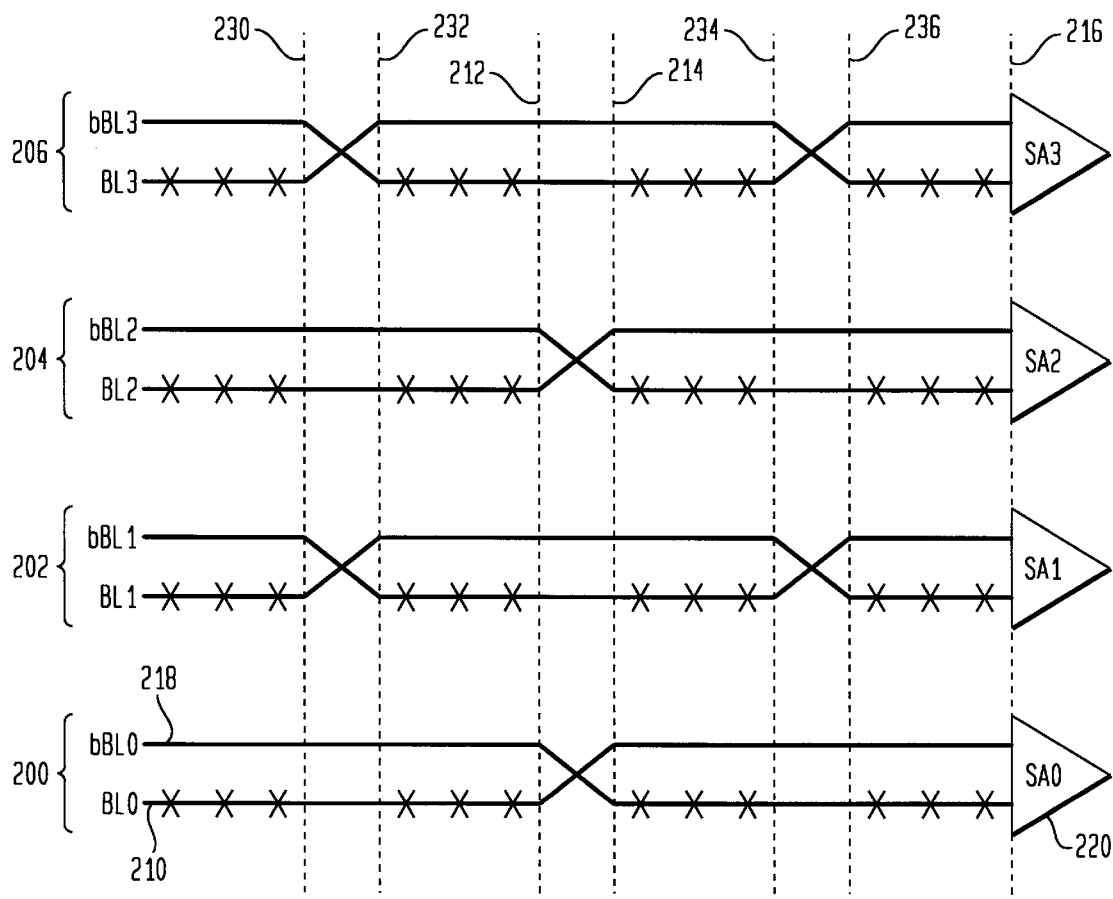

DYNAMIC RANDOM ACCESS MEMORY ARRAYS AND METHODS THEREFOR

BACKGROUND OF THE INVENTION

The present invention relates to dynamic random access memory (DRAM) circuits. More particularly, the present invention relates to techniques for reducing the size of dynamic random access memory circuits that employ multiple metal layers to implement their true and complement bit lines.

A DRAM circuit typically comprises one or more arrays of memory cells. Each array typically includes a plurality of memory cells arranged in rows and columns. A plurality of bit lines and word lines are employed to address individual memory cells of the array. Word lines are typically disposed in a direction that is orthogonal to the direction of the bit lines. Bit lines are coupled to the memory cells, with individual pairs of bit lines coupled to individual strips of memory cells. The term "strip" is employed since the bit line pairs run horizontally and are coupled to rows of memory cells in some DRAMs while they may run vertically and are coupled to columns of memory cells in other DRAMs.

Bit lines in the bit line pair are typically complementary (e.g., if one of the bit line carries a low voltage, the other bit line in the pair would carry a high voltage). By specifying a specific word line and a specific bit line pair, a specific memory cell in the memory array may be addressed for reading or writing. For sensing a stored charge on a memory cell, a sense amplifier which is coupled to the bit line pairs may be employed.

As is well known in the art, some DRAM circuits (e.g., those employing $7F^2$, $6F^2$ or smaller cells) may employ multiple metal layers to implement their bit lines. The term $nF^2$ refers to the size of the memory cell wherein F represents the dimension of the specified design rule employed for fabricating the memory cell. These metal layers are typically insulated from one another and from the underlying memory cells by dielectric layers. When multiple metal layers are provided, the two bit lines of the bit line pair may be implemented in two separate metal layers. By way of example, bit line BL0 of a bit line pair may be implemented in the lower metal layer while its complement bit line bBL0 may be implemented in the upper metal layer (the prefix "b" signifies that it is a complementary bit line). Multiple metal layers are used since they may, in some cases, allow the chip designer to reduce the size of the DRAM circuit.

In the previous example, all the cells of the strip of memory cells that coupled to the bit line pair are typically coupled only to bit line BL0. This is because bit line BL0 is implemented in the lower metal layer, which is closer to the memory cells relative to the upper metal layer (in which bit line bBL0 is implemented). FIG. 1 illustrates this situation wherein all the memory cells of the strip of memory cells (represented by the X's) that couple to the bit line pair BL0/bBL0 are coupled to bit line BL0 (102). Because of this, the capacitance and/or resistance associated with bit line BL0 (102) is typically substantially different from that associated with bit line bBL0 (104). As can be appreciated by those skilled in the art, the differential in the capacitances and resistances of bit lines BL0 (102) and bBL0 (104) adversely affects the performance of sense amplifier SA0 (106).

To address the differential in the capacitances and resistances of the bit lines, twisted bit line pairs have been proposed. FIG. 2 illustrates four adjacent bit line pairs 200, 202, 204, and 206 in which each bit line of the bit line pairs is implemented in both the upper metal layer and the lower metal layer. With reference to bit line pair 200, for example, bit line BL0 (210) is implemented in the lower metal layer and is coupled to the underlying memory cells from the left of the drawing to dashed line 212. Between dashed line 212 and dashed line 214, an interlayer contact is provided to couple bit line BL0 to the upper metal layer. From dashed line 214 to dashed line 216, bit line BL0 is implemented in the upper metal layer.

Its complement bit line bBL0 (218) is implemented in the upper metal layer from the left of the drawing to dashed line 212. Between dashed line 212 and dashed line 214, an interlayer contact is provided to couple bit line bBL0 (218) to the lower metal layer. From dashed line 214 to dashed line 216, bit line bBL0 (218) is implemented in the lower metal layer and is coupled to the underlying memory cells. As can be seen from FIG. 2, at least a portion of bit line BL0 (210) is coupled to the memory cells (represented by the X's). At least a portion of bit line bBL0 (218) is also coupled to the memory cells. Accordingly, the sense amplifier SA0 (220) sees roughly the same capacitance and resistance associated with each bit line of the bit line pairs. As can be appreciated by those skilled in the art, this leads to improved sense amplifier performance.

In the prior art, the interlayer contacts that are employed to twist the bit lines (i.e., to connect the bit lines from one metal layer to another metal layer) are implemented outside of the active area of the array. As the term is employed herein, an active area denotes the area of the die wherein there are memory cells and/or word lines. With reference to FIG. 2, for example, the active areas are represented by areas to the left of dashed line 230, between dashed lines 232 and 212, between dashed lines 214 and 234, and between dashed lines 236 and 216. On the other hand, the twisted gaps (i.e., the gaps between active areas within which interlayer contacts are provided to twist the bit lines) are shown as gaps between dashed lines 230 and 232, between dashed lines 212 and 214, and between dashed lines 234 and 236.

Note that the interlayer contacts of adjacent bit line pairs (e.g., bit line pair BL0/bBL0 and bit line pair BL1/bBL1) are offset relative to one another in the X direction. This is due, in part, to layout constraints since the interlayer contacts take up a nontrivial amount of space. An exemplary prior art interlayer contact is illustrated in FIG. 3. In FIG. 3, a contact plug 302 that couples to the two metal layers through the dielectric layer may measure 225 nm by 225 nm. Contact plug 302 is coupled to a landing area 304, which is typically implemented in the lower metal layer. Landing area 304 may measure, for example, at least 425 nm by 425 nm in order to satisfy design rules, such as the C1M01 which specifies that the contact plug has to land 100 nm inside the landing area. Because of the size of the landing area, adjacent bit line pairs typically cannot implement their interlayer contacts such that the interlayer contacts line up at the same X coordinate.

Note also that although bit line pairs BL0/bBL0 do not twist in the twist gap area between dashed lines 230 and 232 of FIG. 2, bit line BL0 of the prior art DRAM array does not couple to any memory cell in this twist gap area (which is employed to implement the interlayer contacts for adjacent bit line pair BL1/bBL1). Likewise, although bit line pair BL1/bBL1 does not twist in the twist gap area between dashed lines 212 and 214, bit line bBL1 of the prior art DRAM array does not couple to any memory cell in this twist gap area (which is employed to implement the interlayer contact for adjacent bit line pairs BL0/bBL0 and BL2/bBL2). Accordingly, no memory cells are actually provided in areas designated as twist gap areas irrespective whether interlayer contacts are provided for the bit line pair disposed in a twist gap area.

FIG. 4 illustrates an exemplary layout of a prior art DRAM array in which separate twisted gap areas are provided between the DRAM active areas in order to implement the interlayer contacts. In the DRAM array of FIG. 4, $6F^2$ (i.e., 3F×2F wherein F represents the design rule) DRAM cells are employed. Further, the bit lines in FIG. 4 follow a specific exemplary design rule wherein the bit lines are disposed generally at a 45° angle where they cross the word lines (the word lines are disposed vertically in the illustration of FIG. 4). The left hand side of FIG. 4 corresponds to the left hand side of FIG. 2. However, the right hand side of FIG. 4 ends a line 234 of FIG. 2 due to space limitation.

In FIG. 4, bit line BL0 (210) of FIG. 2 traverses word lines 400, 402, 404, 406, and 408 while being implemented in the lower metal layer. This corresponds to bit line BL0 (210) of FIG. 2 between the left side of FIG. 2 and dashed line 230. Word lines 400/402, as well as word lines 406/408 are disposed at the edge of the active area and may represent, in some DRAMs, dummy lithography patterns, which are provided to satisfy the requirements of the off-axis photo-lithography technique employed to fabricate devices having very small features. On other DRAMs, however, fewer or even no dummy lithography pattern may be provided. Word line 404, as can be appreciated by those skilled, represents a short hand depiction of multiple (typically 128) word lines disposed in parallel (the repeated word lines are omitted from FIG. 4 to save space). As bit line BL0 (210) traverses active area 410 in the generally downward direction, it is coupled to the memory cells disposed underneath. In some cases, the active area may be thought of as also including the dummy lithography patterns, e.g., dummy lithography patterns 400, 402, 406, and 408 of FIG. 4.

Between dashed lines 230 and 232, no interlayer contact is provided for bit line BL0 (210) as discussed earlier in connection with FIG. 2. However, this twist gap area is provided to implement the interlayer contacts for adjacent bit line pairs BL1/bBL1 (see FIG. 2). Accordingly, no memory cells exist in this area, and bit line BL0 is not coupled to any memory cell in this area. Bit line BL0 (210) continues to be implemented in the lower metal layer until it encounters the twist gap between dashed lines 212 and 214. As in FIG. 2, bit line BL0 (210) is provided with an interlayer contact to allow it to be implemented henceforth in the upper metal layer. This interlayer contact is shown as interlayer contact 420, which is implemented inside landing 422 (implemented in the lower metal layer). Thereafter, bit line BL0 (210) is implemented in the upper metal layer until it exits the drawing on the right hand side (where it eventually is coupled with a sense amplifier).

Complement bit line bBL0 (218) is implemented in the upper metal layer at the left edge of FIG. 4. It traverses active area 410 and the twist gap between dashed lines 230 and 232 without twisting (i.e., without switching metal layers). Complement bit line bBL0 (218) then traverses active area 426. In the twist gap area between dashed lines 212 and 214, it encounters interlayer contact 428, which is coupled to the lower metal layer by a landing 430. Once complement bit line bBL0 is brought to the lower metal layer for coupling with the underlying memory cells, it traverses active area 432 and exits the drawing on the right hand side (where it eventually is coupled with the sense amplifier that also couples with bit line BL0). The reader is invited to compare FIG. 2 and FIG. 4 for further understanding.

Bit line BL1 of FIG. 2, which is in the bit line pair that is adjacent to bit line pair BL0/bBL0, traverses active area 410 while being implemented in the lower metal layer. This corresponds to bit line BL1 of FIG. 2 between the left side of FIG. 2 and dashed line 230. As bit line BL1 traverses active area 410 in the generally downward direction, it is coupled to the memory cells disposed underneath. Between dashed lines 230 and 232, bit line BL1 is switched to the upper metal layer (as shown in FIG. 2). Accordingly, bit line BL1 is coupled with an interlayer contact to allow it to be implemented henceforth in the upper metal layer. This interlayer contact is shown as interlayer contact 440 of FIG. 4, which is implemented inside landing 442 (implemented in the lower metal layer). Thereafter, bit line BL1 is implemented in the upper metal layer until it exits the drawing on the right hand side (where it eventually is coupled with a sense amplifier).

Complement bit line bBL1 is implemented in the upper metal layer at the left edge of FIG. 4. It traverses active area 410 as an upper layer metal bit line. In the twist gap between dashed lines 230 and 232, bit line bBL1 is switched to the lower metal layer (as shown in FIG. 2). Accordingly, bit line bBL1 is coupled with an interlayer contact to allow it to be implemented henceforth in the lower metal layer. This interlayer contact is shown as interlayer contact 444, which coupled to a landing 446 (implemented in the lower metal layer). Thereafter, bit line bBL1 is implemented in the lower metal layer and coupled to the underlying memory cells without twisting (i.e., without switching metal layers) until it exits the drawing on the right hand side of FIG. 4. Again, note that although bit line bBL1 does not twist in the twist gap area between dashed lines 212 and 214, it is not coupled to any memory cell in this twist gap area since the twist gap area is provided for twisting the adjacent bit line pairs BL0/bBL0.

As can be seen in FIGS. 2 and 4, the prior art DRAM architecture separates the twist gap areas from the active areas (where there are memory cells). Since no memory cells are provided in the twist gap areas, the presence of the separate twisted gap areas disadvantageously enlarges the area of the DRAM array without adding additional storage capacity. Undesirably, the presence of the separate twist gap areas leads to enlarged DRAM circuits. In some DRAM arrays, the twist gap may be as wide as 3 microns. If a twist gap is provided every 128 word lines and there are 512 word lines per array, there are three twist gaps per array for a total of 9 microns of twist gap in the X direction. If the DRAM circuit has 64 arrays in the X direction, for example, the DRAM circuit may be enlarged by a total of 576 microns per DRAM circuit, or about 0.6 mm. As can be appreciated by those skilled in the art, this enlargement is highly disadvantageous in modem high density electronic devices.

In view of the foregoing, there are desired improved techniques for minimizing or substantially eliminating the areas required for twisting the bit lines (i.e., switching the metal layers employed for their implementation) in order to reduce the size of the resultant dynamic random access memory circuit.

SUMMARY OF THE INVENTION

The invention relates, in one embodiment, to a dynamic random access memory array having an array of memory cells. Individual cells of the array are addressable by a plurality of word lines and a plurality of bit lines. The memory cells are disposed in active areas of the array. The array of memory cells includes a first strip of memory cells.

The dynamic random access memory array includes a lower metal layer and an upper metal layer disposed above the lower metal layer. The dynamic random access memory array further includes a dielectric layer disposed between the lower metal layer and the upper metal layer.

There is further included a first bit line of the plurality of bit lines which includes a lower metal first bit line portion implemented in the lower metal layer. The lower metal first bit line portion is coupled to a first plurality of memory cells of the first strip of memory cells. The first bit line also includes an upper metal first bit line portion implemented in the upper metal layer. The upper metal first bit line portion is coupled to the lower first metal bit line portion by a first contact through the dielectric layer. The first contact is disposed above one of the active areas.

In another embodiment, the invention includes a method for increasing the density of a dynamic random access memory array. The memory array has memory cells addressable by a plurality of word lines and a plurality of bit lines. The memory cells are disposed in active areas of the array. The array includes a first strip of memory cells. The method includes implementing a first portion of a first bit line of the plurality of bit lines in a lower metal layer of the array. The method further includes coupling the first portion of the first bit line to a first plurality of memory cells of the first strip of memory cells.

Additionally, the method includes implementing a second portion of the first bit line in an upper metal layer of the array. The lower metal layer is at a lower level than the upper metal layer and is insulated therefrom by a layer of dielectric. Further, the method also includes coupling the first portion of the first bit line of with the second portion of the first bit line using a first interlayer contact. The first interlayer contact is implemented in the active areas.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1 illustrates a portion of a prior art DRAM array wherein all the memory cells of the strip of memory cells (represented by the X's) are coupled to the lower bit line.

FIG. 2 illustrates four adjacent bit line pairs of a prior art DRAM array in which twist areas separate from the active areas are provided for twisting the bit lines.

Figure 3:
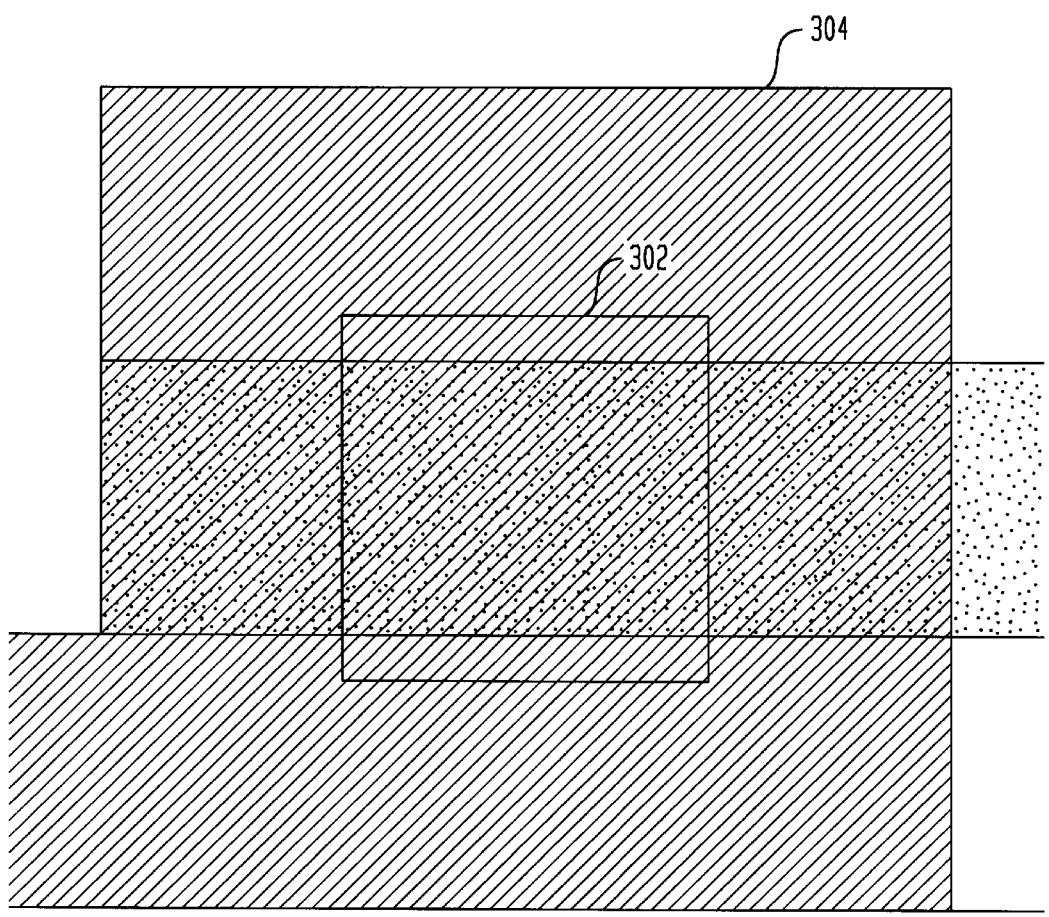

An exemplary prior art interlayer contact is illustrated in FIG. 3.

Figure 4:
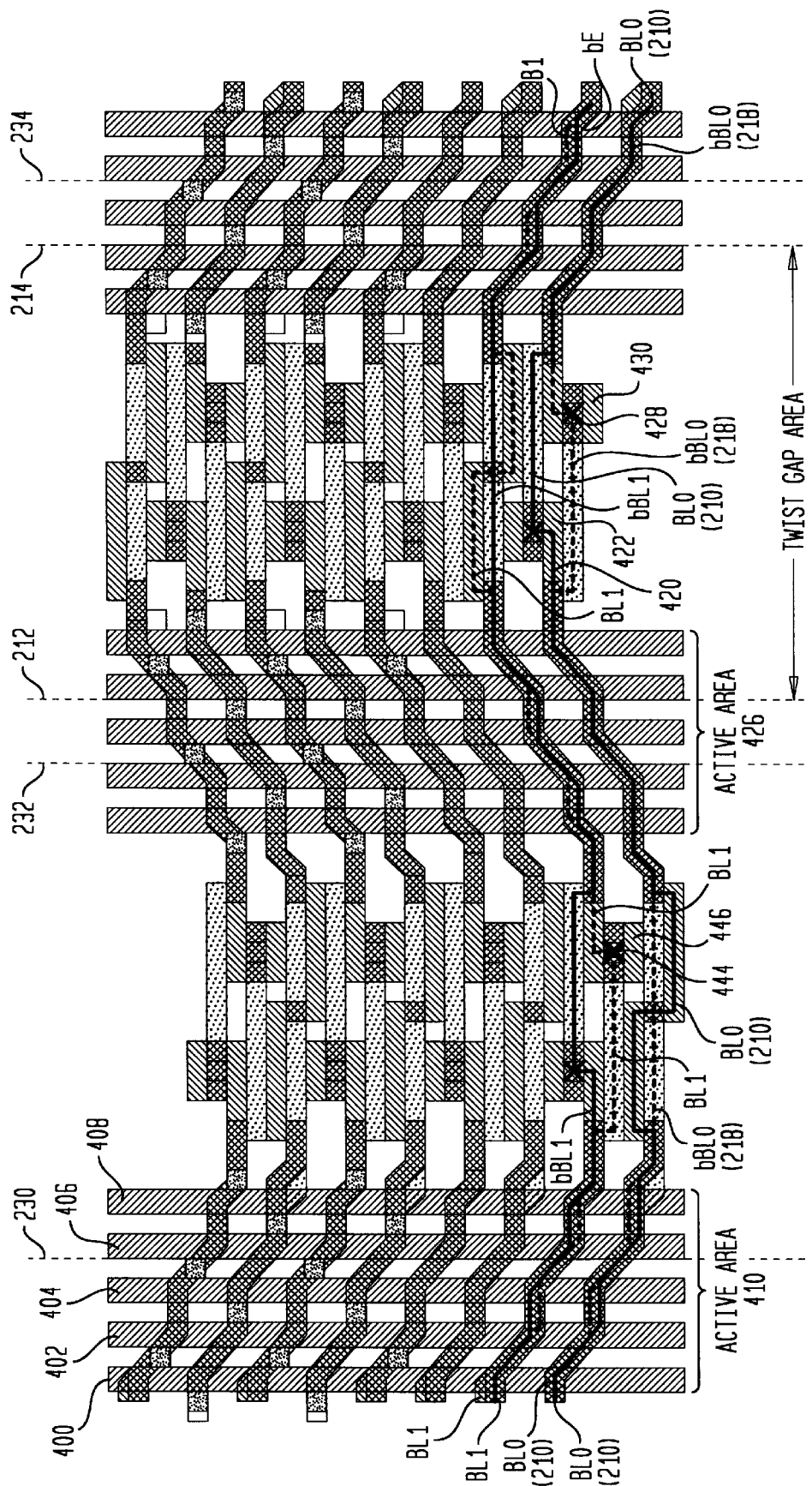

FIG. 4 illustrates an exemplary layout of a prior art DRAM array in which separate twisted gap areas are provided between the DRAM active areas in order to implement the interlayer contacts.

Figure 5:
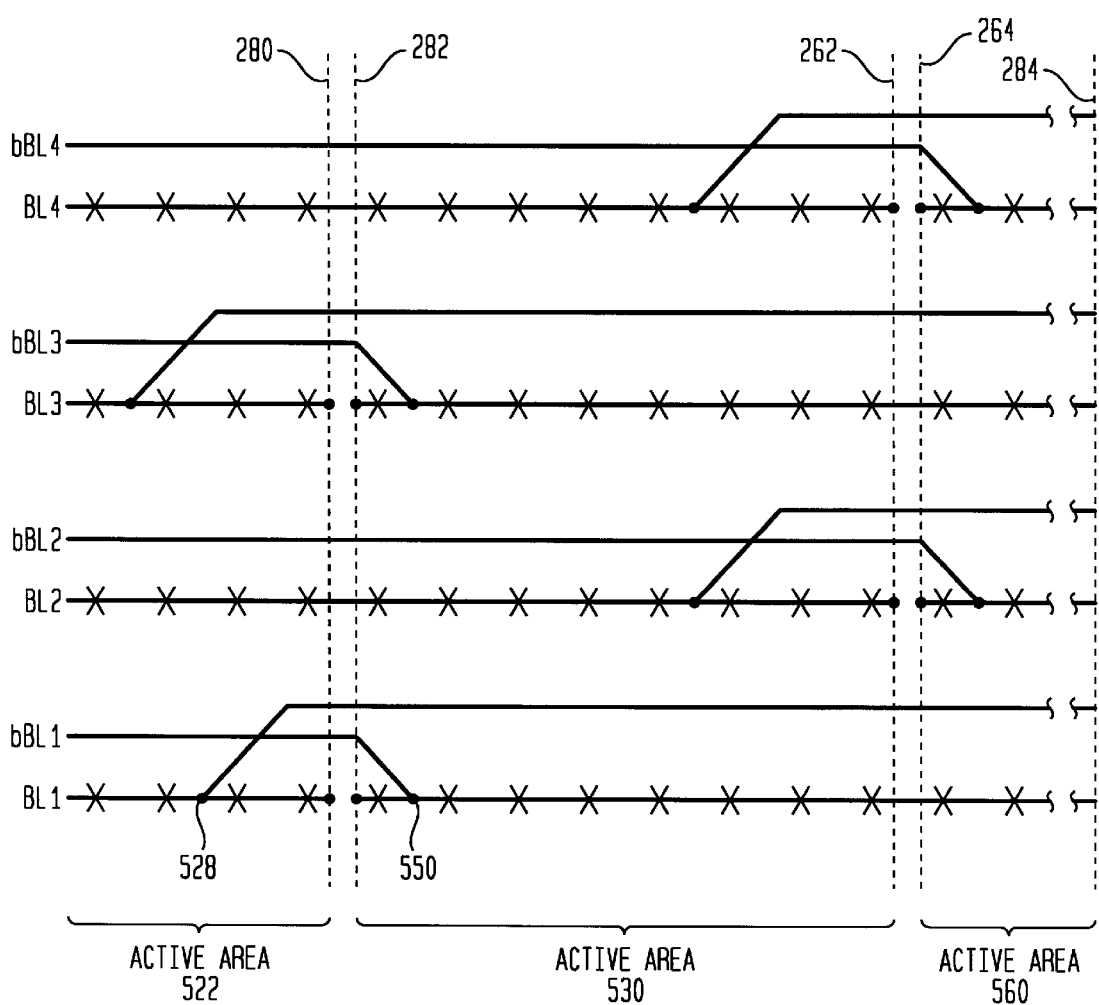

FIG. 5 illustrates, in accordance with one embodiment of the present invention, a DRAM array design that advantageously eliminates the need to provide separate twist gap areas apart from the active areas in order to implement the interlayer contacts.

Figure 6:
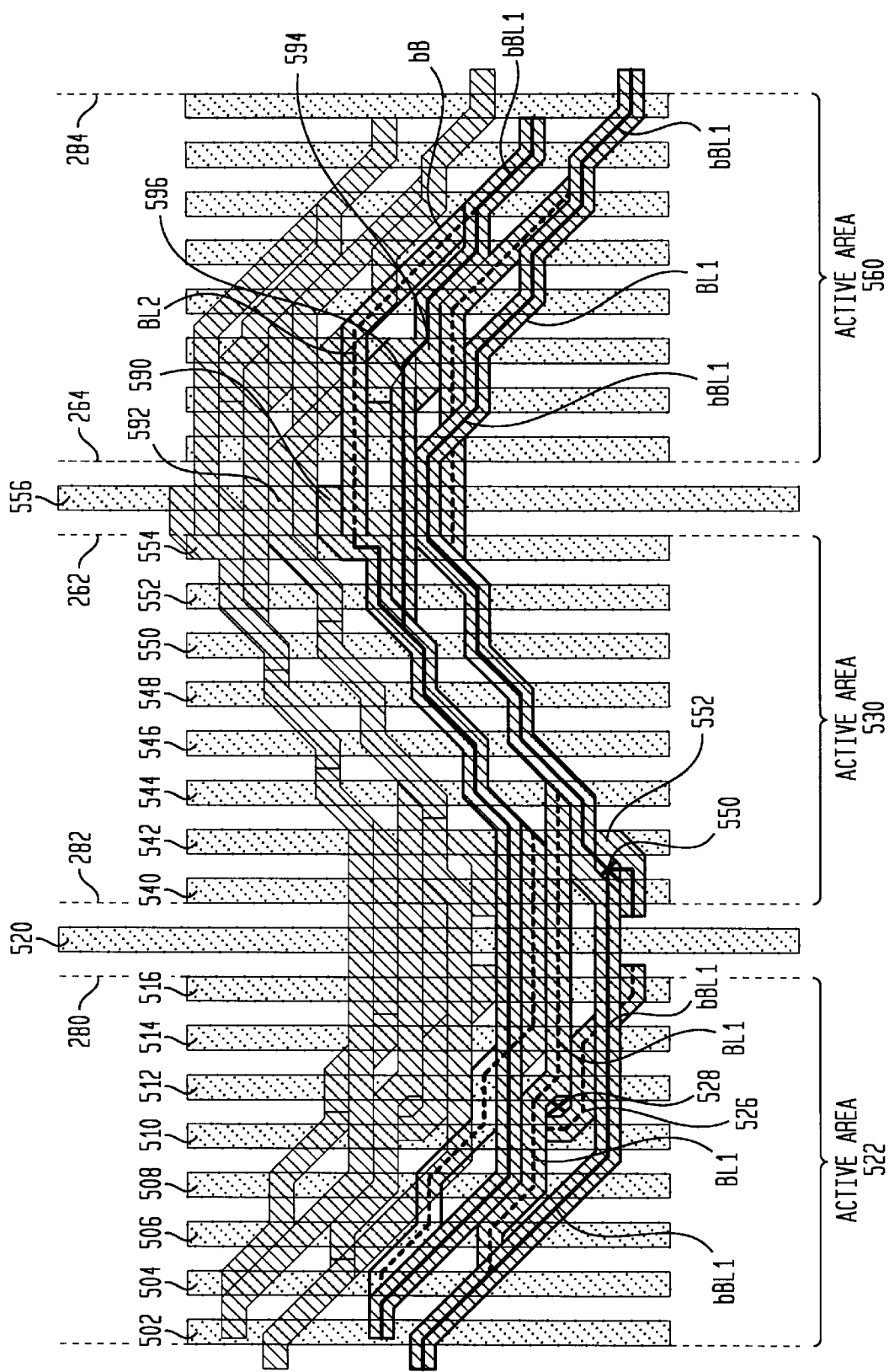

FIG. 6 illustrates, in accordance with one embodiment of the present invention, a layout for a DRAM array implemented so as to substantially reduce or eliminate the separate twist gap areas.

Figure 7:
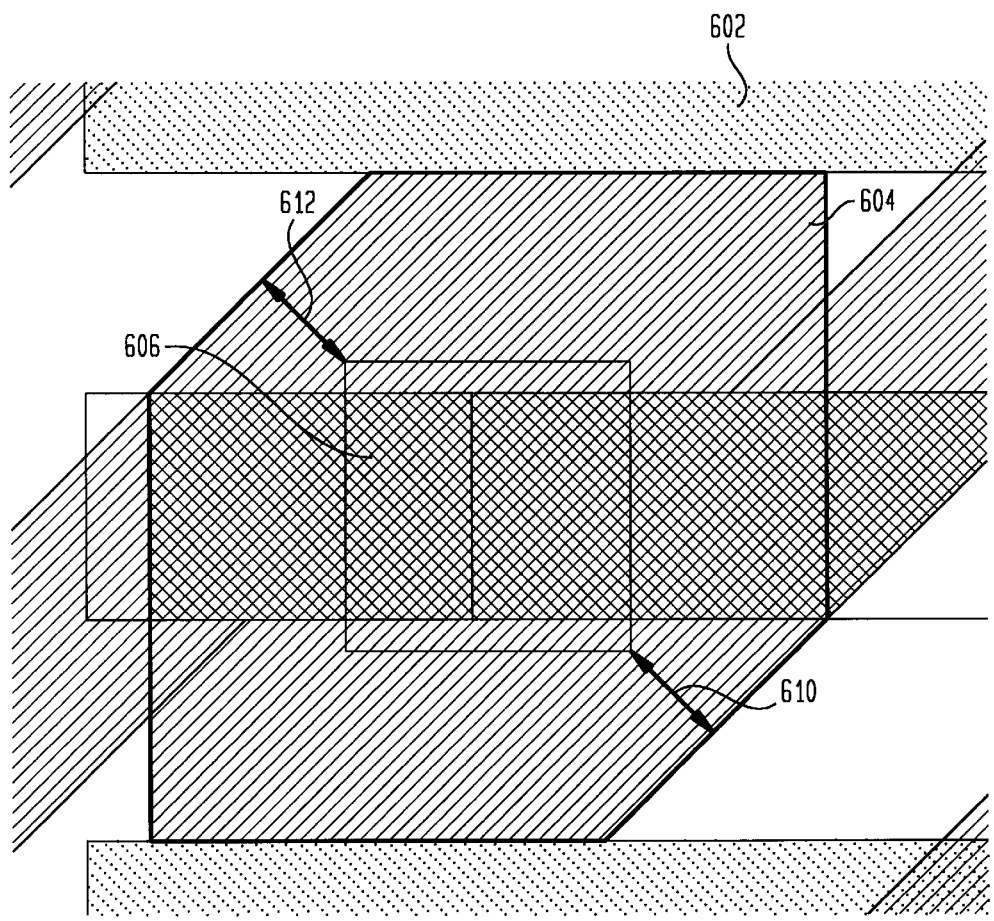

FIG. 7 illustrates, in accordance with one aspect of the present invention, an exemplary interlayer contact that may be employed to twist bit lines of the inventive DRAM array layout of FIG. 6.

Figure 8:
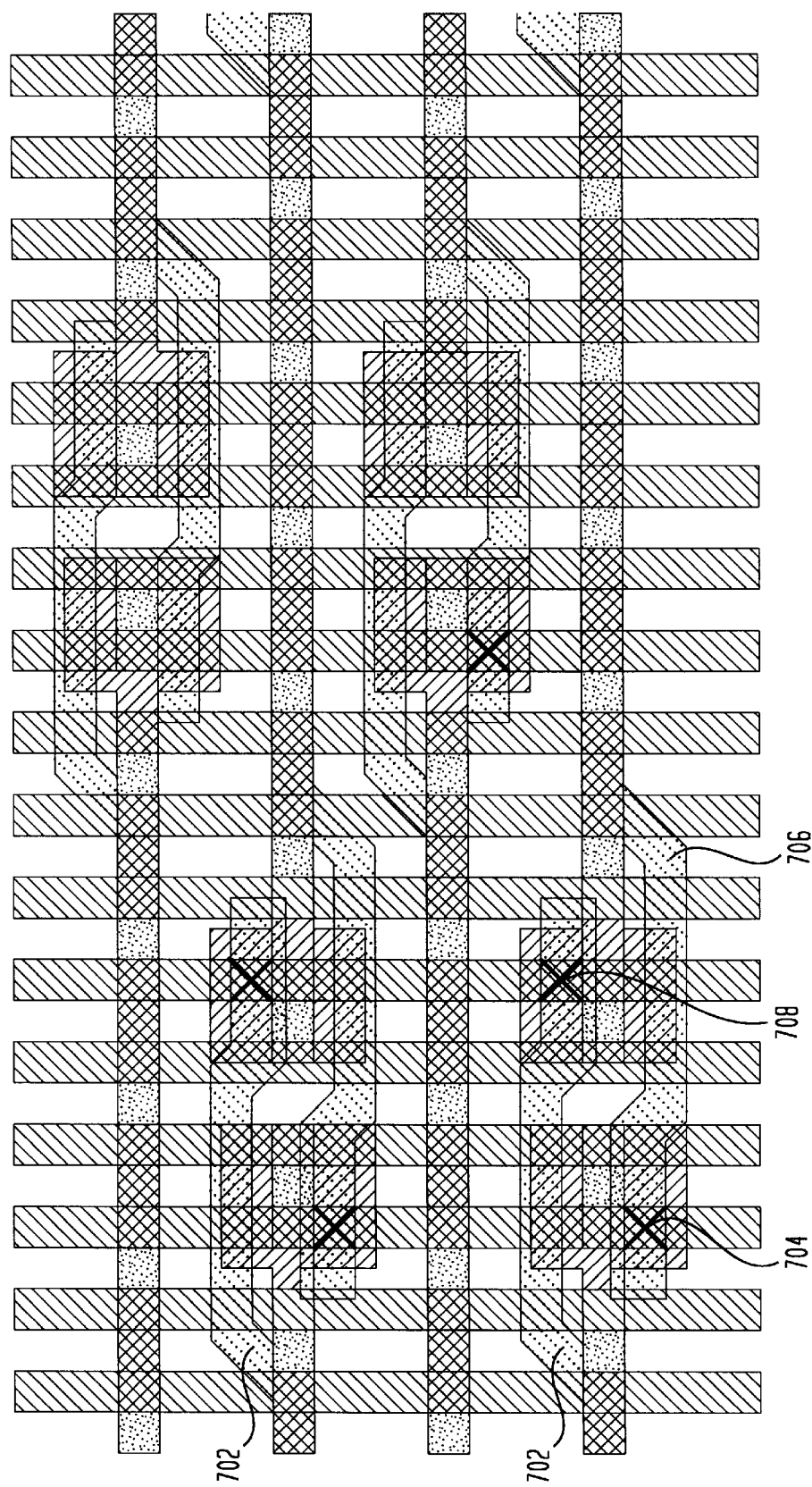

FIG. 8 illustrates, in accordance with one embodiment of the present invention, another layout for a DRAM array implemented so as to substantially reduce or eliminate the separate twist gap areas.

DETAILED DESCRIPTION OF THE INVENTION

The present invention will now be described in detail with reference to a few illustrative embodiments as provided in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In accordance with one aspect of the present invention, there is provided in improved DRAM array design which advantageously minimizes or substantially eliminates the twist gap areas in order to reduce the size of the DRAM circuit. In contrast with prior art techniques which place the interlayer contacts in twist gap areas separate from the active areas, one aspect of the invention involves placing the interlayer contacts (which are employed for twisting the bit lines) in the active areas, thereby eliminating the need to provide separate twist gap areas in the DRAM array.

The inventive DRAM size reduction technique is implemented on DRAM arrays that employ at least two metal layers to implement their bit lines. In one embodiment, the inventive DRAM size reduction technique is implemented on DRAM arrays whose bit lines run at an angle (e.g., about 45° angle) with the word lines. In another embodiment, the inventive DRAM size reduction technique is implemented on DRAM arrays whose bit lines run substantially orthogonal to the word lines.

To further discuss the features and advantages of the present invention, FIG. 5 illustrates, in accordance with one embodiment of the present invention, a DRAM array design that advantageously eliminates the need to provide separate twist gap areas apart from the active areas in order to implement the interlayer contacts. In FIG. 5, the interlayer contacts that are provided to twist the bit lines are advantageously provided within the active areas themselves. With reference to bit line BL1 of FIG. 5, for example, an interlayer contact 528 is provided to couple bit line BL1 from the lower metal layer (where it is coupled to the underlying memory cells) to the upper metal layer. Note that this interlayer contact 528 is provided within the active area to the left of dashed line 280. Likewise, an interlayer contact 550 is provided to couple complement bit line bBL1 from the upper metal layer down to the lower metal layer (where it is coupled with the underlying memory cells). Also note that this interlayer contact 550 is provided within the active area to the right of dashed line 282.

To maximize density, the portion of bit line BL1 that is implemented in the lower metal layer is permitted to continue to the right even after it is twisted upward (by interlayer contact 528). As shown in FIG. 5, the portion of bit line BL1 that is implemented in the lower metal layer does not terminate until it is roughly near the vicinity of dashed line 280. Likewise, the portion of bit line bBL1 that is implemented in the lower metal layer is permitted to extend to the left of interlayer contact 550 to maximize density. As shown in FIG. 5, the portion of complement bit line bBL1 that is implemented in the lower metal layer starts well to the left of interlayer contact 550 (i.e., it extends to roughly near the vicinity of dashed line 282). Accordingly, the areas which are devoid of memory cells underneath are substantially minimized (narrowed only to the area between dashed lines 280 and 282, or the area between dashed lines 262 and 264 in FIG. 5) instead of spanning the entire gap between interlayer contacts. As can be appreciated by those skilled in the art, the minimization of die areas that do not support memory cells underneath substantially increases the density of the resultant DRAM circuit.

The area between dashed line 280 and 282 (or between dashed lines 262 and 264) is referred to herein as the interface area since it interfaces between two adjacent active areas (e.g., active area 522 and 530). The interface area is generally much smaller than a prior art twist gap area. For some DRAM arrays that require their bit lines to cross the word lines at an angle (e.g., about 45° in one example), the interface area is employed to facilitate the change in the directions of the bit lines (e.g., from a generally downward sloping direction to a generally upward sloping direction or vice versa). In these cases, the interface area may be as small as 1 micron wide (compared to the 3 micron wide twist gap area of the prior art layout of FIG. 4). FIG. 6 illustrates an exemplary layout for such an embodiment. In other DRAMs that do not require their bit lines to cross their word lines at an angle (i.e., the bit lines are allowed to be orthogonal to the word lines as they cross), the interface area may be substantially eliminated. FIG. 8 illustrates an exemplary layout for such an embodiment.

In the embodiment of FIG. 6, the bit lines run at about a 45° angle relative to the word lines. Bit lines BL1/bBL1 are depicted as the bit line pair at the bottom of the figure. Bit line pair BL0/bBL0 has been omitted to allow the discussion of other bit line pairs to further understanding.

Bit line BL1 of FIG. 6 traverses word lines 502, 504, 506, 508 while being implemented in the lower metal layer (and coupled to the memory cells underneath). This corresponds to bit line BL1 of FIG. 5 between the left side of FIG. 5 and dashed line 280. Near about the vicinity of dashed line 280 (i.e., near about the vicinity of the interface between active areas 522 and 530), bit line BL1 is twisted and is coupled to the upper metal layer as shown in FIG. 5. In prior art FIG. 4, this corresponds to the twisting of bit line BL1 in the twist area between dashed lines 230 and 232. As stated before, however, this provision of a large, separate twist gap area unnecessarily increases the circuit size. In contrast, the invention permits the twisting to take place in the active area near the vicinity of the interface between two active areas. With reference to FIG. 6, the twisting of bit line BL1 takes place as bit line BL1 encounters a landing 526 and an interlayer contact 528 in active area 522 (near bit line 510 and 512 of FIG. 6). It should be noted that this occurs while bit line BL1 is still in the active area near the vicinity of the interface between active area 522 and 530. Further, although bit interlayer contact 528 is shown in between word lines 510 and 512 for ease of visualization, such is not a placement requirement.

A portion of bit line BL1 is permitted to continue past the interlayer connect point and to traverse the word lines in active area 522 in the generally downward sloping direction until it approaches dashed lines 280. In other words, this extension travels in a direction away from the portion of bit line BL1 that is implemented in the upper metal layer. This extension of the lower metal bit line past the interlayer connect point increases the number of memory cells the lower metal bit line can couple with by assuring that the memory cells disposed near the interface area (delineated by dashed lines 280 and 282) can still connect to the bit lines. Accordingly, the area devoted solely to interfacing adjacent active areas (and devoid of memory cells underneath) is substantially minimized or reduced, thereby increasing DRAM circuit density and reducing overall DRAM circuit size.

Once bit line BL1 is brought to the upper metal layer, it completes its traversal of active area 522 by crossing word lines 512, 514, and 516 in a generally horizontal direction as shown in FIG. 6. With reference to FIG. 5, bit line BL1 does not twist again even as it reaches dashed line 284. This is also depicted in FIG. 6 as bit line BL1 traverses dummy lithographic line 520, word lines 540, 542, and 544 in the generally horizontal direction. After bit line BL1 crosses word line 544, it angles upward without twisting until it meets word line 554. Crossing the interface area surrounding dummy lithographic line 556 is performed in a generally horizontal direction (bit line BL1 is now at the bottom-most position in FIG. 6 in the vicinity of dummy lithographic line 556). After crossing dummy lithographic line 556, bit line BL1 continues to be implemented in the upper metal layer and traverses in the generally downward direction in the figure until it exits at dashed line 284.

Complement bit line bBL1 of FIG. 6 traverses word lines 502, 504, 506, 508, 510, 512, 514, and 516 of active area 522 while being implemented in the upper metal layer. This corresponds to bit line bBL1 of FIG. 5 between the left side of FIG. 5 and dashed line 280. Near about the vicinity of dashed line 280, i.e., near the vicinity of the interface area, bit line bBL1 is twisted and is coupled to the lower metal layer as shown in FIG. 5. In prior art FIG. 4, this corresponds to the twisting of bit line bBL1 in the twist gap area between dashed lines 230 and 232. Again, the invention permits the twisting to take place in the active area near the vicinity of the interface between two active areas 522 and 530.

With reference to FIG. 6, the twisting of bit line bBL1 takes place after bit line bBL1 crosses dummy lithographic line 520 and traverses the first word line 540 of active area 530. Between word line 540 and 542, bit line bBL1 encounters a contact 550, which is coupled to a landing 552 in the lower metal layer. Note that this occurs while bit line bBL1 is in the active area near the vicinity of the interface between active areas 522 and 530. Once bit line bBL1 is brought to the lower metal level, it is coupled to the memory cells.

A portion of bit line bBL1 in the lower metal layer is extended to the left of contact 550 as shown in FIG. 6. In other words, this extension is permitted to travel in a direction away from the portion of bit line bBL1 that is implemented in the upper metal layer. This extension of the lower metal bit line past the interlayer connect point assures that the memory cells disposed near the interface area (delineated by dashed lines 280 and 282) can still connect to bit line bBL1. As discussed, this extension substantially minimizes or eliminates the area devoted solely to interfacing adjacent active areas to increase DRAM circuit density and reduce DRAM circuit size.

In accordance with one aspect of the present invention, once the bit line is twisted, it is permitted to traverse the remaining word lines in a generally horizontal direction so that it can change direction upon reaching the adjacent active area. This is depicted in FIG. 6 as bit line BL1 travels to the right in a generally downward sloping direction, twists, travels in a generally horizontal direction across the interface area, and switches to a generally upward sloping direction. If the bit line that should be twisted near the vicinity of an interface area does not twist prior to crossing into the adjacent active area, it may, without twisting, change direction and travel in the generally horizontal direction to traverse the interface (as bit line bBL1 is permitted to do starting from word line 510). After it traverses the interface area and is twisted in the adjacent active area, bit line bBL1 then travels in the generally upward direction until it approaches the vicinity of the next interface between active areas (i.e., approaching dummy lithographic line 556).

After bit line bBL1 is brought to the lower metal layer, it completes its traversal of active area 530 by crossing word lines 542, 544, 546, 548, 550, 552, and 554 in the generally upward direction. In FIG. 6, complement bit line bBL1 is disposed under the previously discussed true bit line BL1 most of the way between word lines 544 and word line 554. Crossing the interface area surrounding dummy lithographic line 556 is performed in a generally horizontal direction (bit line bBL1 is now at second from the bottom-most position in FIG. 6 in the vicinity of dummy lithographic line 556). After crossing dummy lithographic line 556, bit line bBL1 continues to be implemented in the lower metal layer and traverses in the generally downward direction in the figure until it exits at dashed line 284.

As can be seen from the foregoing, the invention permits the bit line pair BL1/bBL1 to twist within active areas near the vicinity of the interface between active areas 522 and 530 without requiring the provision of a separate twist gap area apart from the active areas (as is done in the prior art). In other words, the interlayer contacts employed to perform the twisting are disposed within the active areas themselves near the vicinity where the bit lines are expected to twist. In the embodiment of FIG. 6, dummy lithographic word lines 520 and 556 are provided to satisfy the requirements of off-axis photolithography. Accordingly, the interface area, such as that between the right edge of word line 516 and the left edge of word line 540, is approximately 1 micron (for 0.175 micron design rule). As will be shown in FIG. 8, however, some DRAM designs may not require the use of dummy lithography patterns. In such cases, the interface area may be completely eliminated, affording DRAM designers great flexibility with the regard to the locations of the interlayer contacts and the frequency with which the bit lines should be twisted.

Bit line BL2 and bit line bBL2 of FIG. 2 are also highlighted in FIG. 6 to further facilitate understanding. Bit line BL2 does not twist near the vicinity of the interface area delineated by dashed lines 280 and 282 as shown in FIG. 5. Accordingly, no interlayer contact is provided for bit line BL2 (which is implemented in the lower metal layer) until bit line BL2 approaches the vicinity of the interface between active area 530 and active area 560 (i.e., near the vicinity of the interface area delineated by dashed lines 262 and 264 of FIG. 5). Twisting of the bit line BL2 is facilitated by contact 590 and landing 592.

Analogously, complement bit line bBL2 does not twist until it is near the vicinity of the interface area delineated by dashed lines 262 and 264 of FIG. 5. Twisting of the bit line BL2 is facilitated by contact 594 and landing 596. Again, both of bit lines BL2 and bBL2 are twisted by interlayer contacts provided within the active areas 530 and 560 instead of interlayer contacts disposed in separate twist gap areas (as is done in prior art FIG. 4). As with bit line pair BL1/bBL1, extensions are provided with portion of the lower metal bit line near the interface area to substantially minimize and/or substantially eliminate the interface area.

The reader is invited to trace bit line pair BL3/bBL3, which twists near the vicinity of the bit gap delineated by dashed lines 280 and 282 for further understanding.

FIG. 7 illustrates an exemplary interlayer contact 602, which may be employed to twist bit lines of the inventive DRAM array layout of FIG. 6. As shown in FIG. 6, the landing area is generally hexagonal to conform to the generally sloping bit lines as they cross the word lines. As interlayer contact 602 is oriented in the generally upward sloping direction, it is employed for twisting generally upward sloping bit lines (e.g., as landing 552 is employed in FIG. 6). However, the landing of FIG. 7 may be rotated 90° to accommodate downward sloping bit lines (as in the case of landing 526 of FIG. 6).

Although not required in every case, the dimension of landing 604 of FIG. 7 is preferably chosen such that the aforementioned C1M01 design rule (which specifies that a contact plug must be at least 100 nm inside of the landing perimeter) is followed. With reference to FIG. 7, the critical dimension is shown by double arrows 610 and 612. It is preferable that these double arrows be at least 100 nm from the edge of landing 604. In one embodiment, the dimension of contact plug 606 is about 225 nm by 225 nm while the dimension of double arrows 610 or 612 is about 110 nm each.

FIG. 8 illustrates, in accordance with one embodiment of the present invention, a layout for portion of a DRAM array in which the bit lines (horizontally disposed in FIG. 8) cross the word lines (vertically disposed in FIG. 8) at about 90°. In FIG. 8, the twisting is performed in accordance with one embodiment of the inventive DRAM area reduction technique. In this embodiment, the design rule is 0.175 micron, with the bit lines being spaced about 0.425 micron apart, resulting in a $7F^2$ cell. Further, no dummy lithographic lines are provided between active areas. Accordingly, the active areas are contiguous, and the bit line twists may take place anywhere or as often as desired by the DRAM designer. Note that twisting now takes place completely within the active areas (the dark squares represent the contacts to the memory cells underneath).

In FIG. 8, the two bit lines (i.e., true and complement) that make up the bit line pair are disposed on top of one another in the lower metal layer and the upper metal layer (albeit insulated from one another by a dielectric layer). Since it is generally undesirable to place the interlayer contacts for the two bit lines of a bit line pair at the same X coordinate due to layout limitation, the bit lines are offset slightly in the Y direction where they are twisted in order to facilitate twisting. For example, bit line BL1 (702 extending from the left hand side of the figure) of the upper metal layer is offset upward in the Y direction to facilitate the placement of interlayer contact 704 (which couples to bit line 706 carrying the complement signal and also implemented in the upper metal layer). Bit line BL1 (which is implemented in the upper metal layer and carries, for example, the true signal of the bit line pair), is brought to the lower metal layer by a contact 708. After it is switched to the lower metal layer, bit line BL1 continues to the right in FIG. 7 (not seen as it is disposed underneath bit line bBL1 706).

Complement bit line bBL1 706 (which is implemented in the upper layer as it extends leftward from the right hand side of FIG. 7) is offset downward in the Y direction to facilitate the placement of the aforementioned interlayer contact 708. Bit line bBL1 (which is implemented in the upper metal layer and carries, for example, the complement signal of the bit line pair), is brought to the lower metal layer by contact 704. After it is switched to the lower metal layer, bit line bBL1 continues to the left in FIG. 7 (not seen as it is disposed underneath bit line BL1 702). To substantially minimize or substantially eliminate any gap between the memory cells in the area where twisting takes place, appropriate extensions may be provided in the lower metal layer past their interlayer connect points. Note that since the bit lines are permitted to run generally orthogonal to the word lines in FIG. 7, conventional square-shaped landing may suffice to implement the interlayer connections.

While this invention has been described in terms of several illustrative embodiments, there are alterations, permutations, and equivalents which fall within the scope of this invention. It should be noted that although DRAMs have employed for discussion herein, the inventive twist area reduction technique may be applied to any circuit (not necessarily DRAM) in which there is a need to reduce the area reserved for implementing the interlayer contacts. Further, although the interlayer contacts (at least of every other bit line pair) have been shown herein to line up generally at the same X coordinate, such is not a requirement. As can be appreciated by those skilled in the art, the invention essentially permits interlayer contacts to be implemented anywhere convenient within the active areas. Accordingly, the circuit designer is free to decide where and how often a particular bit line should be twisted without incurring undue area penalty. Along the same line, although the disclosure discusses twisting near the interface areas, such is also not a requirement. It is therefore intended that the following appended claims be interpreted as including all such alterations, permutations, and equivalents as fall within the true spirit and scope of the present invention.

What is claimed is:

1. A dynamic random access memory array having an array of memory cells, individual cells of said array being addressable by a plurality of word lines and a plurality of bit lines, said memory cells being disposed in active areas of said array, said array of memory cells includes a first strip of memory cells, comprising:
    a lower metal layer;
    an upper metal layer disposed above said lower metal layer;
    a dielectric layer disposed between said lower metal layer and said upper metal layer; and
    a first bit line of said plurality of bit lines including,
        a lower metal first bit line portion implemented in said lower metal layer, said lower metal first bit line portion being coupled to a first plurality of memory cells of said first strip of memory cells, and
        an upper metal first bit line portion implemented in said upper metal layer, said upper metal first bit line portion being coupled to said lower first metal bit line portion by a first contact through said dielectric layer, said first contact being disposed above one of said active areas.

2. The dynamic random access memory array of claim 1 wherein said plurality of bit lines are disposed at about a 45° angle with said plurality of word lines.

3. The dynamic random access memory array of claim 1 wherein said plurality of bit lines are disposed orthogonal with said plurality of word lines.

4. The dynamic random access memory array of claim 1 further comprising a second bit line complementary to said first bit line, said second bit line including,
    a lower metal second bit line portion implemented in said lower metal layer, said lower metal second bit line portion being coupled to a second plurality of memory cells of said first strip of memory cells,
    an upper metal second bit line portion implemented in said upper metal layer, said upper metal second bit line portion being coupled to said lower second metal bit line portion by a second contact through said dielectric layer, said second contact being disposed above one of said active areas.

5. The dynamic random access memory array of claim 4 wherein said first bit line and said second bit line are coupled to a sense amplifier configured to sense a charge stored in one of said first strip of memory cells.

6. The dynamic random access memory array of claim 5 wherein said first contact and said second contact are positioned such that said sense amplifier experiences substantially equal capacitances on said first bit line and said second bit line.

7. The dynamic random access memory array of claim 4 wherein said first contact and said second contact are offset relative to one another along the X-axis.

8. The dynamic random access memory array of claim 7 wherein said first contact is disposed in a first active area of said active areas, said second contact is disposed in a second active area of said active areas adjacent said first active area.

9. The dynamic random access memory array of claim 8 further comprising a dummy lithographic line disposed between said first active area and said second active area, said dummy lithographic line being formed to conform to the requirements of an off-axis photolithography process.

10. The dynamic random access memory array of claim 8 wherein said lower metal first bit line portion includes a first lower metal extension to increase the number of memory cells said lower metal first bit line portion can couple to, said first lower metal extension extending from said first contact area in a direction away from said upper metal first bit line portion.

11. The dynamic random access memory array of claim 10 wherein said lower metal second bit line portion includes a second lower metal extension to increase the number of memory cells said lower metal second bit line portion can couple to, said second lower metal extension extending from said second contact area in a direction away from said upper metal second bit line portion and toward said first lower metal extension.

12. The dynamic random access memory array of claim 1 wherein said memory cells are designed to be smaller than $7F^2$, wherein F represents a dimension of a design rule employed to fabricate said memory cells.

13. The dynamic random access memory array of claim 1 wherein said memory cells are designed to be $6F^2$, wherein F represents a dimension of a design rule employed to fabricate said memory cells.

14. A method for increasing density of a dynamic random access memory array, said memory array having memory cells addressable by a plurality of word lines and a plurality of bit lines, said memory cells being disposed in active areas of said array, said array includes a first strip of memory cells, comprising:
    implementing a first portion of a first bit line of said plurality of bit lines in a lower metal layer of said array;
    coupling said first portion of said first bit line to a first plurality of memory cells of said first strip of memory cells;
    implementing a second portion of said first bit line in an upper metal layer of said array, said lower metal layer being at a lower level than said upper metal layer and is insulated therefrom by a layer of dielectric; and coupling said first portion of said first bit line of with said second portion of said first bit line using a first interlayer contact, said first interlayer contact being implemented in said active areas.

15. The method of claim 14 further comprising:

implementing a first portion of a second bit line of said plurality of bit lines in said lower metal layer of said array, said second bit line being a complement of said first bit line;

coupling said first portion of said second bit line to a second plurality of memory cells of said first strip of memory cells;

implementing a second portion of said second bit line in said upper metal layer of said array; and coupling said first portion of said second bit line of with said second portion of said second bit line using a second interlayer contact, said second interlayer contact being implemented in said active areas.

16. The method of claim 15 wherein said first interlayer contact and said second interlayer contact is implemented in adjacent active areas of said active areas.

17. The method of claim 16 further comprising:

extending said first portion of said first bit line in a direction away from said second portion of said first bit line to minimize any interface area between said adjacent active areas.

18. The method of claim 17 further comprising:

extending said first portion of said second bit line in a direction away from said second portion of said second bit line to minimize said any interface area between said adjacent active areas.

19. A dynamic random access memory array having an array of memory cells, individual cells of said array being addressable by a plurality of word lines and a plurality of bit lines, said memory cells being disposed in active areas of said array, said array of memory cells includes a first strip of memory cells, comprising:

a lower metal layer;

an upper metal layer disposed above said lower metal layer, a dielectric layer disposed between said lower metal layer and said upper metal layer; and a first bit line of said plurality of bit lines including,
a lower metal first bit line portion implemented in said lower metal layer, said lower metal first bit line portion being coupled to a first plurality of memory cells of said first strip of memory cells,
an upper metal first bit line portion implemented in said upper metal layer, and
first means for coupling said upper metal first bit line portion with said lower first metal bit line portion through said dielectric layer, said first coupling means being disposed above said active areas.

20. The dynamic random access memory array of claim 1 further comprising a second bit line complementary to said first bit line, said second bit line including, a lower metal second bit line portion implemented in said lower metal layer, said lower metal second bit line portion being coupled to a second plurality of memory cells of said first strip of memory cells, an upper metal second bit line portion implemented in said upper metal layer, and second means for coupling said upper metal second bit line portion to said lower second metal bit line portion through said dielectric layer, said second coupling means being disposed above said active areas.

* * * * *